United States Patent
Sivasubramaniam

(10) Patent No.: US 8,520,402 B1
(45) Date of Patent: Aug. 27, 2013

(54) DECOUPLING CAPACITOR CIRCUIT ASSEMBLY

(75) Inventor: Suresh Sivasubramaniam, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1556 days.

(21) Appl. No.: 11/258,681

(22) Filed: Oct. 25, 2005

(51) Int. Cl.
*H05K 1/11* (2006.01)
*H05K 1/14* (2006.01)

(52) U.S. Cl.
USPC ........... 361/794; 361/790; 361/795; 361/803; 174/259; 174/260

(58) Field of Classification Search
USPC ......... 174/252, 255, 260, 261, 266; 257/642, 257/668, 691, 698, 700, 702, 759, 720–730; 361/748, 760–763, 790–795, 803
See application file for complete search history.

(56) References Cited

U.S. PATENT DOCUMENTS

| | | | | |
|---|---|---|---|---|
| 4,426,249 A * | 1/1984 | Brown et al. | ................. | 156/653 |
| 5,273,938 A * | 12/1993 | Lin et al. | ........................ | 437/207 |
| 5,418,471 A * | 5/1995 | Kardos | ......................... | 324/758 |
| 5,473,512 A * | 12/1995 | Degani et al. | ................. | 361/760 |
| 5,691,041 A * | 11/1997 | Frankeny et al. | ............. | 428/209 |
| 5,798,567 A * | 8/1998 | Kelly et al. | ..................... | 257/723 |
| 5,847,936 A * | 12/1998 | Forehand et al. | ............. | 361/794 |
| 6,075,285 A * | 6/2000 | Taylor et al. | ................... | 257/691 |
| 6,222,246 B1 * | 4/2001 | Mak et al. | ...................... | 257/532 |
| 6,252,760 B1 * | 6/2001 | Sen | ............................. | 361/306.3 |
| 6,342,681 B1 * | 1/2002 | Goldberger et al. | .......... | 174/261 |
| 6,351,393 B1 * | 2/2002 | Kresge et al. | .................. | 361/795 |
| 6,373,714 B1 * | 4/2002 | Kudoh et al. | .................. | 361/760 |
| 6,373,717 B1 * | 4/2002 | Downes, Jr. et al. | .......... | 361/795 |
| 6,611,419 B1 * | 8/2003 | Chakravorty | ............. | 361/306.3 |
| 6,760,232 B2 | 7/2004 | Smith et al. | | |
| 6,770,969 B2 * | 8/2004 | Mosley | .......................... | 257/724 |
| 6,794,581 B2 * | 9/2004 | Smith et al. | .................... | 174/260 |
| 6,875,921 B1 | 4/2005 | Conn | | |
| 6,891,258 B1 | 5/2005 | Alexander et al. | | |
| 6,946,733 B2 * | 9/2005 | Poole et al. | .................... | 257/737 |
| 7,045,470 B2 * | 5/2006 | Bao et al. | ....................... | 438/762 |
| 7,164,572 B1 * | 1/2007 | Burdon et al. | ................. | 361/302 |

OTHER PUBLICATIONS

U.S. Appl. No. 10/698,704, filed Oct. 31, 2003, Conn.
U.S. Appl. No. 10/698,906, filed Oct. 31, 2003, Conn.

* cited by examiner

*Primary Examiner* — Tuan T Dinh
(74) *Attorney, Agent, or Firm* — Robert M. Brush; LeRoy D. Maunu

(57) ABSTRACT

Decoupling capacitor circuit assembly is described. In one example, a circuit assembly includes a passive substrate, a plurality of terminals, and at least one capacitor. The passive substrate includes a top surface and a bottom surface. The plurality of terminals is formed on the top surface and is configured for electrical communication with a respective plurality of lands on a printed circuit board (PCB). The at least one capacitor is mounted to the bottom surface of the passive substrate and is configured to provide decoupling capacitance for an integrated circuit (IC) on the PCB. Each capacitor is coupled to a pair of the plurality of terminals. In another example, a circuit assembly includes a PCB, and IC mounted to the PCB, a passive substrate mounted to the PCB, and at least one capacitor mounted to the passive substrate for providing decoupling capacitance for the IC.

18 Claims, 2 Drawing Sheets

DECOUPLING CAPACITOR CIRCUIT ASSEMBLY

FIELD OF THE INVENTION

One or more aspects of the present invention relate generally to printed circuit board structures and, more particularly, to a decoupling capacitor circuit assembly.

BACKGROUND OF THE INVENTION

Systems that include integrated circuit (IC) devices typically include decoupling capacitors (also known as bypass capacitors). A typical decoupling capacitor is coupled between power and ground pins (i.e., terminals) of a packaged IC to reduce noise on the power system within the IC. The decoupling capacitors also prevent any sag or dip in the supply voltage due to switching events occurring inside the IC. While in some cases the die and/or package of the IC include some decoupling capacitance, the amount of capacitance required is such that one or more additional discrete decoupling capacitors are usually added external to the packaged device.

Depending on the application, few to several 10 s of decoupling capacitors are mounted on a printed circuit board (PCB) within a few inches of the packaged IC. The physical size of these discrete decoupling capacitors varies. In any case, the discrete decoupling capacitors occupy valuable real estate on the PCB around the IC. It is desirable to mitigate this use of real estate around the IC in order to improve the quality of routing conductive traces between circuit components on the PCB, which improves signal quality. Accordingly, there exists a need in the art for a decoupling capacitor circuit assembly that uses less real estate on the PCB around the IC.

SUMMARY OF THE INVENTION

Decoupling capacitor circuit assembly is described. In one embodiment, a circuit assembly includes a passive substrate, a plurality of terminals, and at least one capacitor. The passive substrate includes a top surface and a bottom surface. The plurality of terminals is formed on the top surface and is configured for electrical communication with a respective plurality of lands on a printed circuit board (PCB). The at least one capacitor is mounted to the bottom surface of the passive substrate and is configured to provide decoupling capacitance for an integrated circuit (IC) on the PCB. Each capacitor is coupled to a pair of the plurality of terminals.

In another embodiment, a circuit assembly includes a PCB, and IC mounted to the PCB, a passive substrate mounted to the PCB, and at least one capacitor mounted to the passive substrate for providing decoupling capacitance for the IC. In one embodiment, the PCB includes a top surface and a bottom surface. The IC is mounted to the top surface of the PCB and the passive substrate is mounted to the bottom surface of the PCB. The IC includes a plurality of terminals arranged in a pattern. The PCB includes a first plurality of lands arranged in the pattern and respectively coupled to the plurality of terminals and a second plurality of lands respectively coupled to at least a portion of the first plurality of lands. The passive substrate includes a plurality of terminals respectively coupled to the second plurality of PCB lands.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
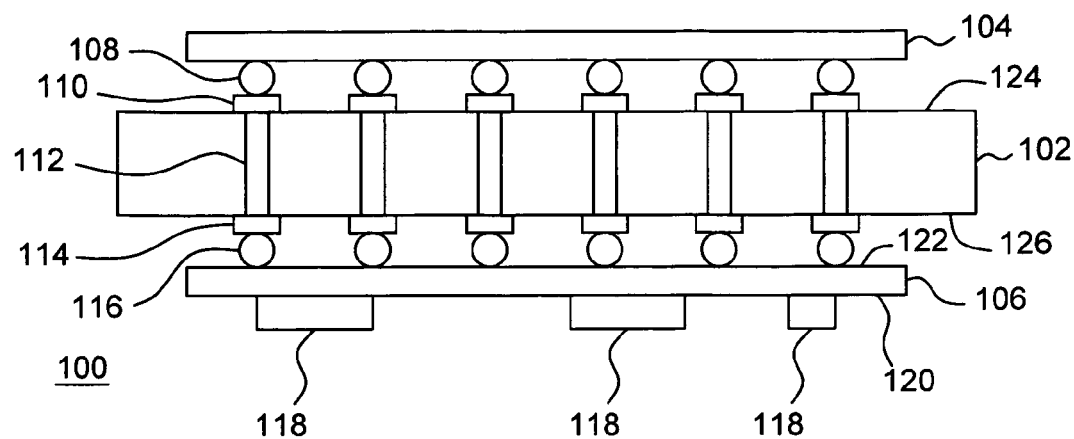
FIG. 1 is a side view depicting an exemplary embodiment of a circuit assembly constructed in accordance with one or more aspects of the invention.

FIG. 1 is a side view depicting an exemplary embodiment of a circuit assembly 100 constructed in accordance with one or more aspects of the invention. The circuit assembly 100 includes a packaged integrated circuit (IC) 104, a printed circuit board (PCB) 102, and a passive substrate 106. The packaged IC 104 may comprise any type of IC known in the art, such as a programmable logic device (PLD), application specific integrated circuit (ASIC), and the like. The packaged IC 104 includes a plurality of terminals 108 arranged in a pattern. In the embodiment shown, the packaged IC 104 comprises a ball grid array (BGA) or like type package, and the terminals 108 comprise solder balls. Those skilled in the art will appreciate that the packaged IC 104 may comprise other types of packages known in the art, such as pin grid array (PGA), quad flat pack (CFP), and the like, where the terminals 108 comprise pins rather than solder balls. Notably, some of the terminals 108 are configured to receive power and ground for the packaged IC 104, while others of the terminals 108 are configured to receive or provide signals (e.g., clock signals, I/O signals).

The PCB 102 comprises a top surface 124 and a bottom surface 126. The PCB 102 may comprise a multi-layer structure having one or more conductive layers and one or more dielectric layers (not shown), as is well known in the art. The conductive layers may include layers for providing power and ground for use by components on the PCB 102, such as the packaged IC 104, as well as signal layers. The dielectric layers comprise one or more well-known dielectric materials, such as ceramic materials, organic materials, and non-ceramic, in-organic materials, as well as combinations of such materials (i.e., composite materials).

The PCB 102 includes a plurality of PCB lands 110 disposed on the top surface 124 and a plurality of PCB lands 114 disposed on the bottom surface 126. The PCB lands 110 comprise conductive portions formed on the top surface 124 arranged in the same pattern as the terminals 108 of the packaged IC 104. The PCB lands 110 are electrically coupled to various conductive traces and conductive planes. Notably, some of the PCB lands 110 are configured to provide power and ground to the packaged IC 104 and are coupled to power and ground planes of the PCB 102. The packaged IC 104 is electrically and mechanically coupled to the PCB 102 via solder joints between the terminals 108 and the PCB lands 110. The terminals 108 are soldered to the PCB lands 110 using well known techniques. Notably, the ones of the terminals 108 configured to receive power and ground are coupled to corresponding ones of the PCB lands 110 configured to provide power and ground.

The PCB lands 114 comprise conductive portions formed on the bottom surface 126 of the PCB 102. In one embodiment, the PCB lands 114 are arranged in the same pattern as the terminals 108 and the PCB lands 110, as shown in the present embodiment. The PCB lands 114 are electrically coupled to the PCB lands 110 using vias 112 that extend between the top surface 124 and the bottom surface 126. The vias 112 may be formed in a well known manner such that the PCB lands 110 are electrically coupled to the PCB lands 114.

The number of terminals 108 and corresponding PCB lands 110 and 114 is illustrative. In practice, the number of terminals and corresponding lands could be larger or smaller, but would typically be larger. For example, the number of terminals 108 may be selected to match the number of pads on the die of the packaged IC 104.

The passive substrate 106 includes a top surface 122 and a bottom surface 120. The passive substrate 106 comprises one or more layers of dielectric material. The dielectric material may be ceramic material, organic material, inorganic non-ceramic material, and the like, as well as combinations of such materials. Different layers of the passive substrate may be formed of different dielectric materials. The substrate 106 is "passive" in that it does not include any conductive layers for providing power and ground. In this manner, the passive substrate 106 can be made at low cost compared to power laminate structures that have power and ground planes therein. In addition, the passive substrate 106 can be made thinner than power laminate structures, which reduces the overall vertical height of the PCB 102.

The passive substrate 106 includes a plurality of terminals 116 on the top surface 120. In the embodiment shown, the terminals 116 comprise solder balls. The terminals 116 may alternatively comprise pins. The terminals 116 are arranged in the same pattern as the PCB lands 114. The passive substrate 106 is electrically and mechanically coupled to the PCB 102 via solder joints between the terminals 116 and the PCB lands 114. The terminals 116 are soldered to the PCB lands 114 using well known techniques. One or more decoupling capacitors 118 are mounted to the bottom surface 120 of the passive substrate 106. Each of the decoupling capacitors 118 is electrically coupled to a pair of the terminals 116 (e.g., a pair of terminals coupled to power and ground). In one embodiment, the decoupling capacitors 118 comprise discrete capacitors that are surface mounted to the passive substrate 106 on the bottom surface 106. In this manner, the decoupling capacitors 118 are coupled between power and ground terminals of the packaged IC 104 to provide decoupling capacitance for the packaged IC 104.

In another embodiment, the PCB lands 114 may include only lands for the power and ground terminals of the terminals 108. That is, rather than a one-to-one correspondence between the PCB lands 114 and the PCB lands 110, there may be a PCB land 114 for each PCB land 110 that provides power or ground to the packaged IC 104. The terminals 116 are configured to match the pattern of the PCB lands 114. Accordingly, the terminals 116 only include terminals for the power and ground lands of the PCB lands 110.

Figure 2:
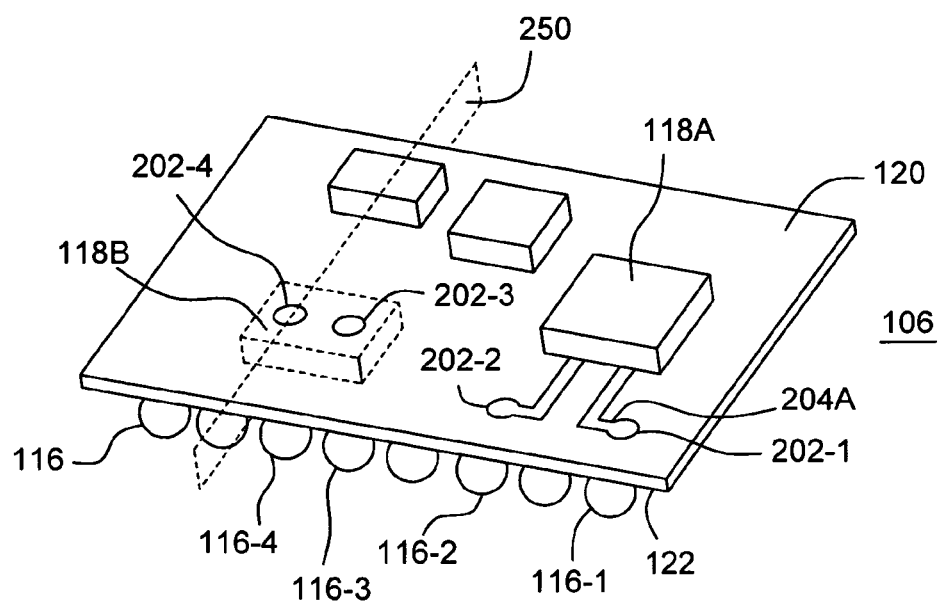
FIG. 2 is a perspective view depicting an exemplary embodiment of a passive substrate of FIG. 1 in accordance with one or more aspects of the invention.

FIG. 2 is a perspective view depicting an exemplary embodiment of the passive substrate 106 of FIG. 1 in accordance with one or more aspects of the invention. In the embodiment shown, the passive substrate 106 includes four decoupling capacitors 118, including a capacitor 118A and a capacitor 118B. It is to be understood that the passive substrate 106 may include more or less decoupling capacitors. The capacitor 118A is coupled to conductive traces 204A and 204B formed on the bottom surface 126 of the passive substrate 106. The conductive traces 204A and 204B are electrically coupled to conductive portions 202-1 and 202-2, respectively, formed on the bottom surface 120. The conductive portions 202-1 and 202-2 are in electrical communication with terminals 116-1 and 116-2, respectively, of the terminals 116. The terminals 116-1 and 116-2 are coupled to power and ground, respectively, for specific ones of the terminals 108 of the packaged IC 104.

The capacitor 118B is coupled directly to conductive portions 202-3 and 202-4 formed on the bottom surface 120. The conductive portions 202-3 and 202-4 are in electrical communication with terminals 116-3 and 116-4, respectively, of the terminals 116. The terminals 116-3 and 116-4 are coupled to power and ground, respectively, for specific ones of the terminals 108 of the packaged IC 104. In this manner, the capacitors 118A and 118B provide decoupling capacitance for the packaged IC 104.

In general, the passive substrate 106 includes a plurality of conductive portions 202 formed on the bottom surface 120, each of which is coupled to a specific one of the terminals 116. Each of the capacitors 118 is mounted on the bottom surface 120 in electrical communication with a pair of the conductive portions 202. Some of the capacitors 118 may be directly coupled to associated pairs of the conductive portions 202, while others of the capacitors 118 may be coupled to associated pairs of the conductive portions 202 through conductive traces 204 formed on the bottom surface 120. In this manner, the capacitors 118 may be disposed on the bottom surface 120 independently with respect to the particular pattern of the terminals 108 of the packaged IC 104.

Figure 3:
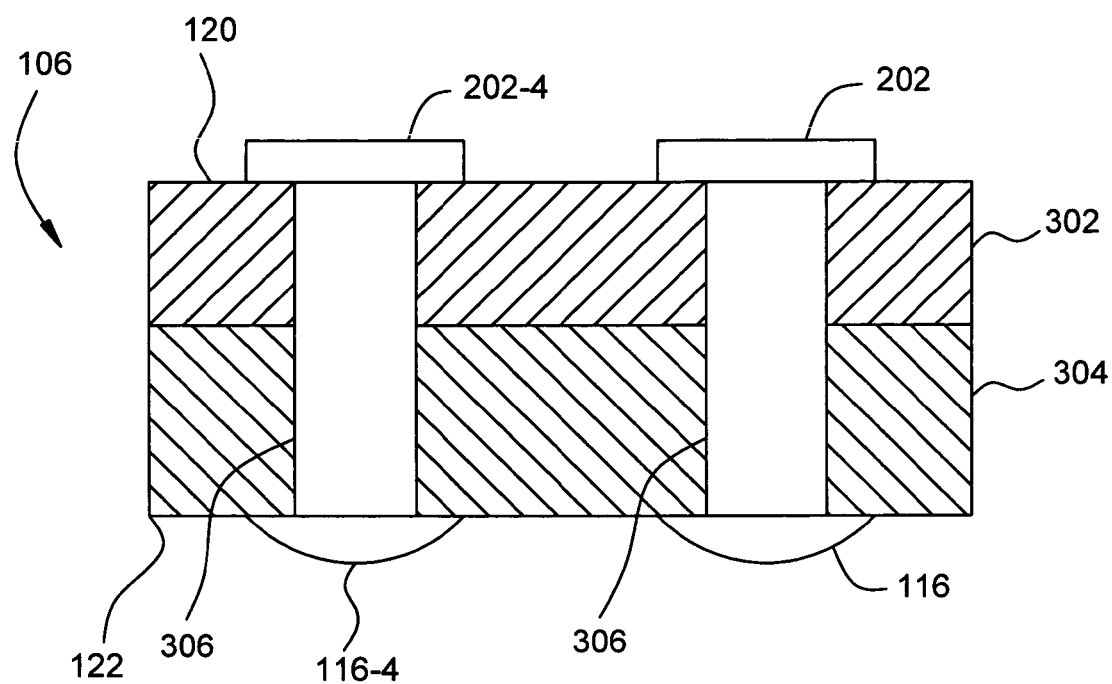
FIG. 3 is a cross-sectional view depicting an exemplary embodiment of the passive substrate through a cut-away plane of FIG. 2 in accordance with one or more aspects of the invention.

FIG. 3 is a cross-sectional view depicting an exemplary embodiment of the passive substrate 106 through the cut-away plane 250 of FIG. 2 in accordance with one or more aspects of the invention. In the embodiment shown, the passive substrate 106 includes two layers, namely, a layer 302 and a layer 304. It is to be understood that the passive substrate 106 may include more or less layers. Each of the layers 302 comprises dielectric material. Vias 306 are formed within the layers 302 and 304. Each of the vias 206 electrically couples one of the terminals 116 with one of the conductive portions 202. In the embodiment shown, one of the vias 206 electrically couples the terminals 116-4 with the conductive portion 202-4. For purposes of clarity, the capacitors 118 are omitted.

Decoupling capacitor circuit assembly has been described. In one embodiment, decoupling capacitors for a packaged IC on a PCB are mounted to a passive substrate. The passive substrate is in turn mounted to the PCB. The passive substrate may comprise a thin laminate structure (e.g., two dielectric layers), which does not add significant vertical height to the PCB. By mounting the decoupling capacitors on the passive substrate, area on the PCB is conserved, which may reduce the number of required layers and hence cost to manufacture to PCB, as well as improve the quality of signal routing hence yielding better signal quality.

While the foregoing describes exemplary embodiments) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A circuit assembly, comprising:
  a printed circuit board (PCB) having an integrated circuit (IC) on a top surface thereof;
  a passive substrate having a top surface and a bottom surface, the passive substrate comprising a plurality of dielectric layers without conductive layers for power and ground therebetween;

a plurality of terminals, formed on the top surface of the passive substrate, for electrical communication with a respective plurality of lands on a bottom surface of the PCB; and at least one capacitor mounted on the bottom surface of the passive substrate, each of the at least one capacitor being electrically coupled to the IC via a pair of the plurality of terminals to provide a decoupling capacitance for the IC.

2. The circuit assembly of claim 1, further comprising:
vias, formed in the passive substrate, for electrically coupling each of the at least one capacitor to the corresponding pair of the plurality of terminals.

3. The circuit assembly of claim 1, wherein each of the at least one capacitor comprises a discrete capacitor surface mounted to the bottom surface of the passive substrate.

4. The circuit assembly of claim 1, further comprising:
conductive portions formed on the bottom surface of the passive substrate;
wherein each of the at least one capacitor is coupled to the corresponding pair of the plurality of terminals through a pair of the conductive portions.

5. The circuit assembly of claim 4, further comprising:
conductive traces formed on the bottom surface of the passive substrate;
wherein the at least one capacitor is coupled to the corresponding pair of the conductive portions by a pair of the conductive traces.

6. The circuit assembly of claim 1, wherein the plurality of terminals comprise solder balls or pins.

7. A circuit assembly, comprising:
an integrated circuit (IC) having a plurality of terminals disposed in a pattern;
a printed circuit board (PCB) having a first plurality of PCB lands disposed according to the pattern and respectively coupled to the plurality of terminals of the IC and a second plurality of PCB lands respectively coupled to at least a portion of the first plurality of PCB lands;
a passive substrate having a plurality of terminals respectively coupled to the second plurality of PCB lands, the passive substrate comprising a plurality of dielectric layers without conductive layers for power and ground therebetween; and
at least one capacitor disposed on the passive substrate, each of the at least one capacitor being electrically coupled to a pair of the plurality of terminals of the passive substrate.

8. The circuit assembly of claim 7, wherein the PCB includes a top surface and a bottom surface, and wherein the first plurality of PCB lands is disposed on the top surface of the PCB and the second plurality of PCB lands is disposed on the bottom surface of the PCB.

9. The circuit assembly of claim 8, wherein the passive substrate includes a top surface and a bottom surface, and wherein the plurality of terminals of the passive substrate are disposed on the top surface of the passive substrate and the at least one capacitor is disposed on the bottom surface of the passive substrate.

10. The circuit assembly of claim 9, wherein each of the at least one capacitor comprises a discrete capacitor surface mounted to the bottom surface of the passive substrate.

11. The circuit assembly of claim 7, further comprising:
vias, formed in the passive substrate, for electrically coupling each of the at least one capacitor to the corresponding pair of the plurality of terminals of the passive substrate.

12. The circuit assembly of claim 7, further comprising:
conductive portions formed on the passive substrate;
wherein each of the at least one capacitor is coupled to the corresponding pair of the plurality of terminals of the passive substrate through a pair of the conductive portions.

13. The circuit assembly of claim 12, further comprising:
conductive traces formed on the passive substrate;
wherein the at least one capacitor is coupled to the corresponding pair of the conductive portions by a pair of the conductive traces.

14. The circuit assembly of claim 7, wherein the plurality of terminals of the passive substrate comprise solder balls or pins.

15. The circuit assembly of claim 7, wherein the second plurality of PCB lands is disposed according to the pattern and respectively coupled to the first plurality of PCB lands.

16. A circuit assembly, comprising:
a printed circuit board (PCB);
an integrated circuit (IC) mounted to the PCB;
a passive substrate mounted to the PCB, the passive substrate comprising a plurality of dielectric layers without conductive layers for power and ground therebetween; and
at least one capacitor mounted to the passive substrate for providing decoupling capacitance for the IC.

17. The circuit assembly of claim 16, wherein the PCB includes a top surface and a bottom surface, and wherein the IC is mounted to the top surface of the PCB and the passive substrate is mounted to the bottom surface of the PCB.

18. The circuit assembly of claim 16, wherein the IC includes a plurality of terminals arranged in a pattern, wherein the PCB includes a first plurality of lands arranged in the pattern and respectively coupled to the plurality of terminals and a second plurality of lands respectively coupled to at least a portion of the first plurality of lands, and wherein the passive substrate includes a plurality of terminals respectively coupled to the second plurality of PCB lands.

\* \* \* \* \*